United States Patent [19]
Stevenson et al.

[11] Patent Number: 5,100,527
[45] Date of Patent: Mar. 31, 1992

[54] ROTATING MAGNETRON INCORPORATING A REMOVABLE CATHODE

[75] Inventors: David E. Stevenson; Erik J. Bjornard, Geoffrey Humberstone, all of Northfield, Minn.

[73] Assignee: Viratec Thin Films, Inc., Faribault, Minn.

[21] Appl. No.: 600,203

[22] Filed: Oct. 18, 1990

[51] Int. Cl.⁵ .............................................. C23C 14/35
[52] U.S. Cl. ........................... 204/298.22; 204/298.09; 204/298.23
[58] Field of Search .................. 204/298.09, 298.22, 204/298.23, 298.28

[56] References Cited

U.S. PATENT DOCUMENTS

| | | | |
|---|---|---|---|
| 4,166,018 | 8/1979 | Chapin | 204/192.12 |
| 4,356,073 | 10/1982 | McKelvey | 204/192.12 |
| 4,422,916 | 12/1983 | McKelvey | 204/192.12 |
| 4,433,318 | 4/1984 | McKelvey | 204/298.23 |
| 4,445,997 | 5/1984 | McKelvey | 204/298.23 |
| 4,466,877 | 8/1984 | McKelvey | 204/298.23 |
| 4,519,885 | 5/1985 | Innis | 204/192.12 |

Primary Examiner—Aaron Weisstuch
Attorney, Agent, or Firm—Heller, Ehrman, White & McAuliffe

[57] ABSTRACT

A rotatable magnetron having a cathode and a bearing assembly wherein the cathode may be removed from a coating chamber while the bearing assembly remains in place.

28 Claims, 3 Drawing Sheets

ROTATING MAGNETRON INCORPORATING A REMOVABLE CATHODE

BACKGROUND OF THE INVENTION

The present invention relates generally to magnetron sputtering apparatus, and more particularly to rotating magnetrons.

DC reactive sputtering is the deposition process most often used for large area commercial coating applications, such as the application of thermal control coatings to architectural and automobile glazings. In this process, the articles to be coated are passed through a series of in-line vacuum chambers isolated from one another by vacuum locks. This system may be referred to as a continuous in-line system or a glass coater.

Inside the vacuum chambers, a sputtering gas discharge is maintained at a partial vacuum at a pressure of about 3 millitorr. The sputtering gas comprises a mixture of an inert gas, such as argon, with a small proportion of a reactive gas, such as oxygen, for the formation of oxides.

Each chamber contains one or more cathodes held at a negative potential of about $-200$ to $-1000$ volts. The cathodes may be in the form of elongated rectangles, the length of which spans the width of the line of chambers. The cathodes are typically 0.10 to 0.30 meters wide and a meter or greater in length. A layer of material to be sputtered is applied to the cathode surface. This surface layer or material is known as the target or the target material. The reactive gas forms the appropriate compound with the target material.

Ions from the sputtering gas discharge are accelerated into the target and dislodge, or sputter off, atoms of the target material. These atoms, in turn, are deposited on a substrate, such as a glass sheet, passing beneath the target. The atoms react on the substrate with the reactive gas in the sputtering gas discharge to form a thin film.

The architectural glass coating process was made commercially feasible by the development of the magnetically-enhanced planar magnetron. The planar magnetron has an array of magnets arranged in the form of a closed loop and mounted in a fixed position behind the target. A magnetic field in the form of a closed loop is thus formed in front of the target. The field causes electrons from the discharge to be trapped in the field and travel in a spiral pattern, which creates a more intense ionization and higher sputtering rates. Appropriate water cooling is provided to prevent overheating of the target. The planar magnetron is further described in U.S. Pat. No. 4,166,018.

A disadvantage of the planar magnetron is that the target material is only sputtered in the narrow zone defined by the magnetic field. This creates a "racetrack"-shaped sputtering zone on the target. Thus, a "racetrack"-shaped erosion zone is produced as sputtering occurs. This causes a number of problems. For example, (1) localized high temperature build-up eventually limits the power at which the cathodes can operate, and (2) only about 25 percent of the target material is actually used before the target must be replaced.

The rotary or rotating magnetron was developed to overcome some of the problems inherent in the planar magnetron. The rotating magnetron uses a substantially cylindrical cathode and target. The cathode and target are rotated continually over a magnetic array which defines the sputtering zone. As such, a new portion of the target is continually presented to the sputtering zone which eases the cooling problem, allowing higher operating powers. The rotation of the cathode also ensures that the erosion zone comprises the entire circumference of the cathode covered by the sputtering zone. This increases target utilization. The rotating magnetron is described further in U.S. Pat. Nos. 4,356,073 and 4,422,916, the entire disclosures of which are hereby incorporated by reference.

The rotating magnetron requires bearings to permit rotation, and vacuum seals for the drive shaft, the electrical conduits and the cooling conduits. Vacuum and rotary water seals have been used to seal around the drive shaft and the conduits which extend between the coating chamber and the ambient environment. However, such seals have a tendency to develop leaks under conditions of high temperature and high mechanical loading. Various mounting, sealing and driving arrangements for rotating magnetrons are described in U.S. Pat. Nos. 4,443,318; 4,445,997; and 4,466,877, the entire disclosures of which are also hereby incorporated by reference. These patents describe rotating magnetrons mounted horizontally in a coating chamber and supported at both ends.

It is often preferable, however, to support the magnetron at one only end by a cantilever mount. However, the cantilever mounting arrangement produces the highest bearing loads. Several examples of cantilever mounted rotary magnetrons are given in *Design Advances and Applications of the Rotatable Magnetron*, Proceedings of the 32nd National Symposium of the American Vacuum Society, Vol. 4, No. 3, Part 1, pages 388–392 (1986), the entire text of which is hereby incorporated by reference.

If the bearings and seals are located within the coating chamber, space is used which would otherwise be available for cathode length. Further, if the cathode is supported at each end, more chamber space is used than if the cathode were supported at only one end. In either case, the rotating magnetron's efficiency is reduced since the useful sputtering zone of the cathode may not occupy the full width of the coating chamber. Thus, throughput is decreased as only narrow substrates can be coated.

A cantilever mounted magnetron usually includes a bearing housing containing a drive shaft, a rotary vacuum seal, and at least two bearings spaced along the drive shaft, one of which may function as a shaft seal. This bearing assembly is usually bulky and heavy, because of its load requirements. Also, since the cantilever leverage is best maximized by increasing the separation of the individual bearings in the assembly, the assembly is relatively long compared to the cathode length.

Generally, a major portion of the bearing assembly is mounted in the coating chamber through an aperture in the chamber sidewall, leaving only portions of the drive shaft, and the water and electrical conduits outside the chamber. This results in space being occupied by the bearing assembly which could otherwise be occupied by a longer cathode.

The cathode is permanently attached to the bearing assembly by welding the cathode body to an end plug which is an integral part of the bearing assembly. When such a cathode is removed from the coating chamber, for example to replace an eroded target, the entire bearing assembly including the cathode must be removed. Such an assembly may be removed through the top cover of the coating chamber, which means that a clearance space must exist between the free end of the cathode and the adjacent chamber end wall. The clearance space is necessary to allow the bearing assembly, and the drive and fluid connections to be moved free of the mounting aperture in the chamber side wall so that the assembly can be lifted out of the chamber. The clearance space also represents space which could otherwise be occupied by a longer cathode.

The weight of the bearing assembly is usually such that an overhead crane is needed to lift the assembly from the coating chamber. The use of a crane increases the time required for cathode repair and replacement. An in-line coating system may include as many as fifteen magnetrons, more than one of which may have to be removed at any given time. Usually, only one overhead crane is available. Therefore, cathode removal and replacement operations must be carried out in series. As such, the time required for these operations is increased, resulting in lost production time.

In view of the foregoing, an object of the present invention is to provide a cantilever mounted rotating magnetron incorporating a removable cathode so the cathode can be removed from the coating chamber without removing the bearing assembly.

It is a further object of the present invention to provide a cantilever mounted rotating magnetron wherein most of the bearing assembly is located outside the coating chamber, thus permitting the use of longer cathodes.

It is yet another object of the present invention to provide a cathode that may quickly and easily removed from the bearing assembly.

Additional objects and advantages of the invention will be set forth in the description which follows, and in part will be obvious from the description or may be learned by practice of the invention. Other objects and advantages of the invention may be realized and obtained by means of the instrumentalities and combination particularly pointed out in the claims.

SUMMARY OF THE INVENTION

A rotatable magnetron apparatus including a bearing housing and a drive shaft rotatably mounted in the bearing housing such that an end of the shaft extends into an evacuable chamber. A vacuum seal means is provided for sealing the drive shaft to the bearing housing so that an interior portion of the housing is isolated from the chamber. Means are also provided for removably attaching a cathode to the end of the drive shaft inside the chamber so that the cathode can be removed from the chamber while the bearing housing remains in place.

The present invention permits the rapid removal and replacement of a cathode without removing the bearing assembly from the coating chamber. Additionally, the bearing assembly is mounted in the vacuum chamber such that most of the assembly is located outside of the chamber. As such, longer cathodes may be used, thereby increasing the magnetron s operating efficiency.

DESCRIPTION OF THE DRAWINGS

The accompanying drawings, which are incorporated in and constitute a part of the specification, schematically illustrate a preferred embodiment of the present invention and together with the general description given above and the detailed description of the preferred embodiment given below serve to explain the principles of the invention.

DETAILED DESCRIPTION OF THE PREFERRED EMBODIMENT

Figure 1:
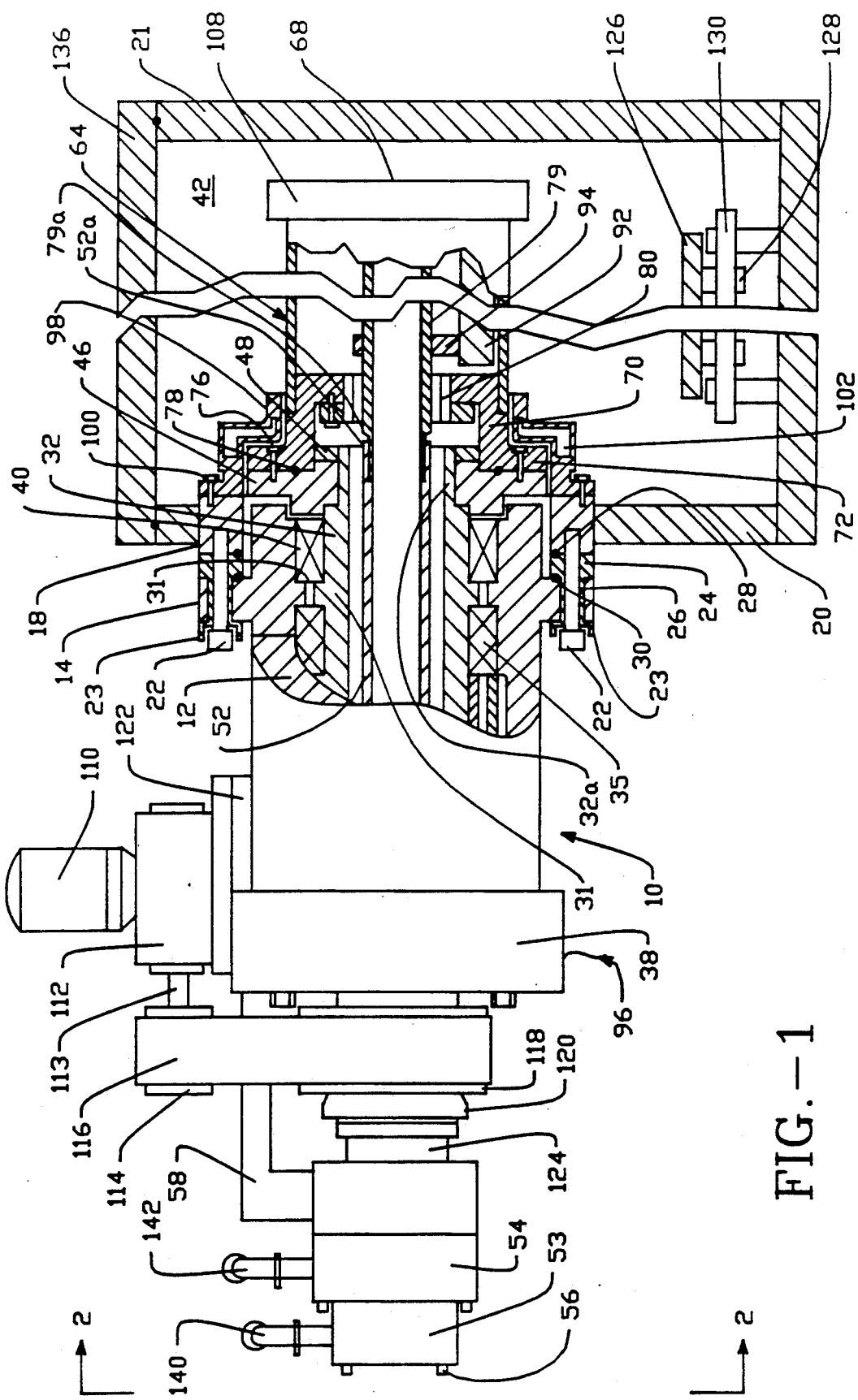
FIG. 1 is a schematic, partial cross-section through a rotating magnetron and coating chamber.
Figure 2:
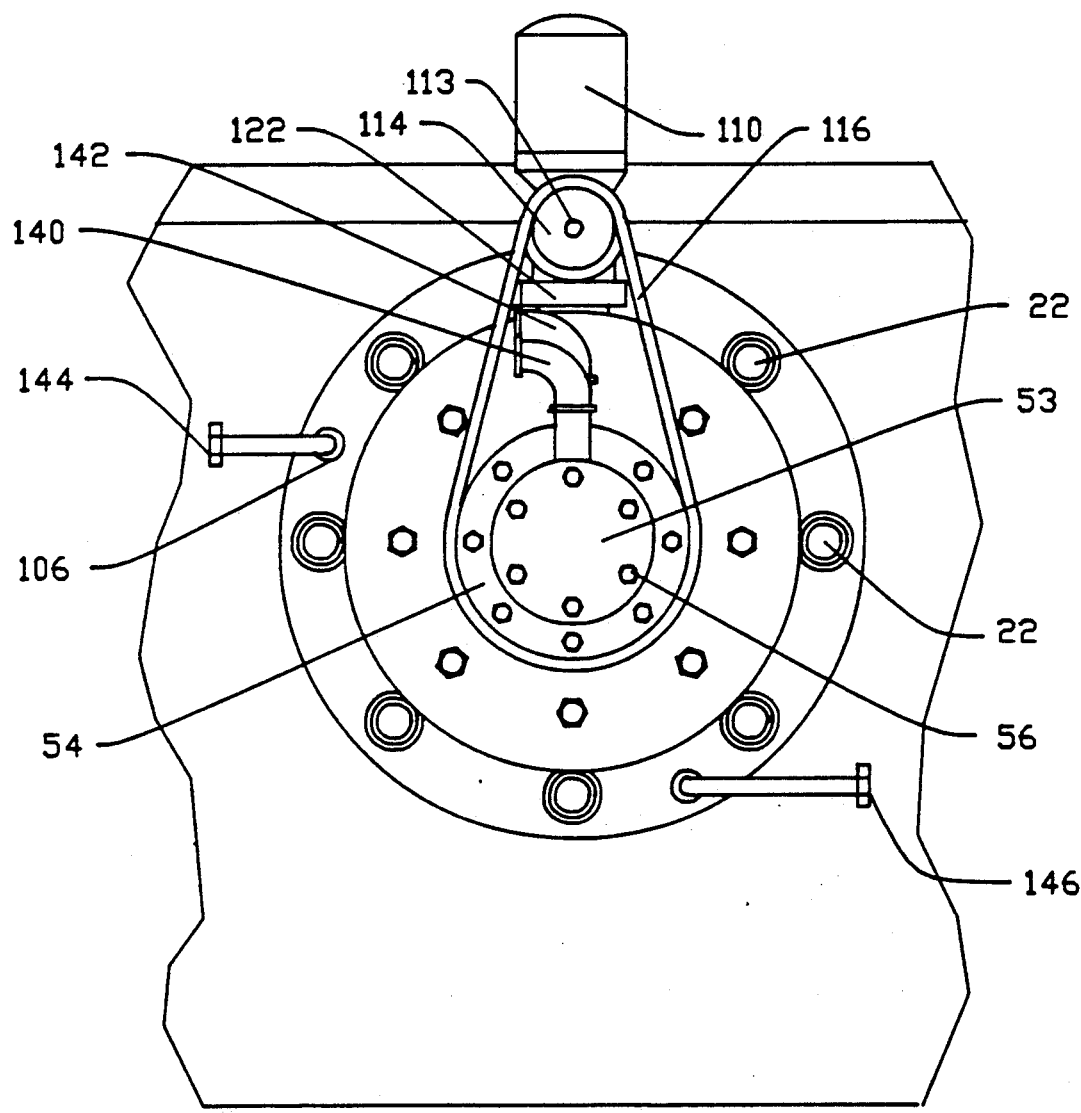
FIG. 2 is a schematic, end view along line 2—2 of FIG. 1.
Figure 3:
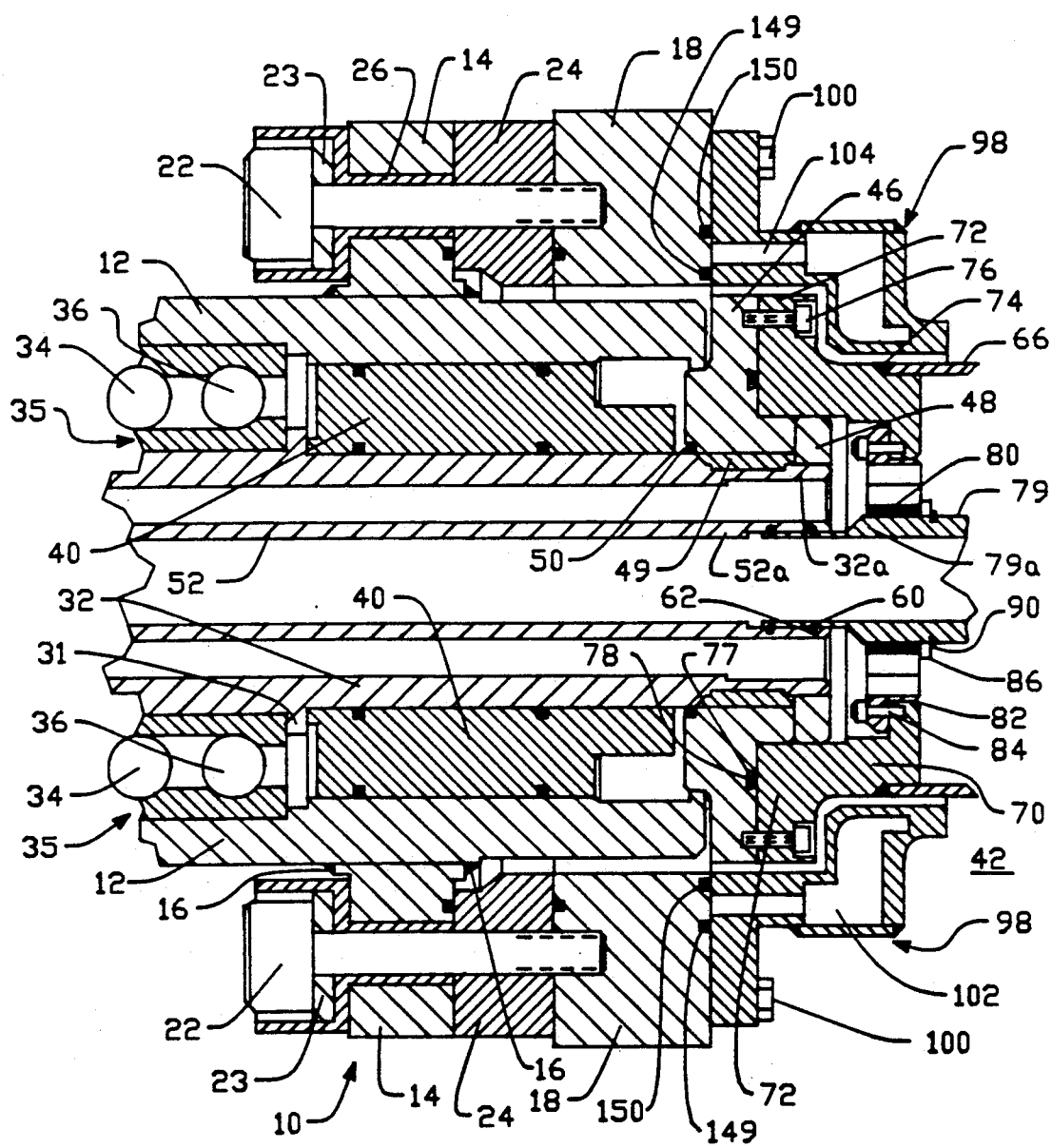
FIG. 3 is an enlarged schematic view of a portion of the apparatus of FIG. 1.

The present invention is described in terms of a preferred embodiment. As illustrated by FIGS. 1, 2 and 3, a bearing assembly or mounting unit 10 comprises a bearing housing 12 having a flange 14 attached thereto by welds 16 (FIG. 3). The bearing housing 12 is mounted to a second flange 18 located in a side wall 20 of an evacuable coating chamber 42. A series of eight bolts 22 and washers 23 secure flange 14 of housing 12 to flange 18 (FIGS. 2 and 3). The mounting unit 10 is electrically insulated from flange 18 by insulating ring 24 and insulating bushings 26. "O" ring seals 28 and 30 are provided to maintain vacuum integrity between flanges 14 and 18.

A hollow drive shaft 32 is supported in bearing housing 12 by ball races 34 and 36 (FIG. 3) of duplex bearing 35, and by a ball race (not shown) mounted in a clamping unit 38. The unit 38 clamps the duplex bearing in position in housing 12. The inner races of all bearings are clamped by bearing nut 120 against a shoulder 31 on shaft 32.

A rotary vacuum seal 40 may be used to maintain a vacuum seal between drive shaft 32 and bearing housing 12 such that an interior portion of housing 12 is isolated from coating chamber 42. Preferably, rotary seal 40 is a ferrofluidic seal. As is known, a ferrofluidic seal incorporates a colloidal suspension of ultramicroscopic magnetic particles in a carrier liquid. Preferably, the ferrofluidic seal is supplied by Ferrofluidic Corporation, 40 Simon Street, Nashua, New York 03061. A preferred seal is Model #5C-3000-C. Other types of seals for the shaft could also be employed. A cathode mounting flange 46 is clamped to drive shaft 32 by a nut 48. The cathode mounting flange 46 is prevented from rotating on drive shaft 32 by a key 49 (FIG. 3), and it is vacuum sealed to the drive shaft by an "O" ring seal 50.

As is known, a cooling fluid transport tube or conduit 52 is supported in a non-rotatable fashion within drive shaft 32 by means (not shown) in the cooling fluid input unit 53. The drive shaft 32, in turn, is rotatably supported within cooling fluid output unit 54. The units 53 and 54 are clamped together by bolts 56 and prevented from rotating by an arm 58 (omitted for clarity in FIG. 2). Cooling fluid for the cathode is fed into input unit 53 via inlet port 140, and removed from output unit 54 via outlet port 142.

As shown in FIG. 3, cooling fluid transport tube 52 has an end thereof 52a substantially in-line with an end 32a of drive shaft 32. The end 52a has a slightly enlarged bore with grooves 60 containing "O" ring seals 62. As discussed below, end 52a mates with the inner end 79a of a fluid transport tube 79 supported in cathode 64. Tube or conduit 79 carries the cooling fluid for the cathode.

Cathode 64 comprises a tubular body 66 sealed at its outer end 68 by a cap. (not shown). A mounting plug 70 having a raised flange portion 72 is attached and sealed to the inner end of tubular body 66 by welds 74 (FIG.

3). The flange 72, and thus the cathode 64, are removably attached to flange 46 by six bolts 76. Vacuum integrity between flanges 46 and 72 is maintained by "O" ring seals 78 disposed in grooves 77 in flange 46. The cathode 64 may be about three feet long and have a diameter of about six inches.

Fluid transport tube 79 is rotatably supported in cathode 64 by first bearing 80, typically a non-metallic sleeve type bearing, and a second bearing (not shown) at cathode outer end 68. The bearing 80 is mounted in inserts 82 (FIG. 3) in plug 70 and held in position by retaining rings 86 and clips 90. The fluid transport tube 79 has a reduced outer diameter at inner end 79a to allow it to be inserted into end 52a of fluid transport tube 52. Tube 79 is keyed into tube 52 by a pin and slot arrangement (not shown) so that tube 79 cannot rotate within tube 52. As such, the fluid transport tube 79 is held stationary while cathode 64 rotates around it.

A magnet bar 92 is supported by fluid transport tube 79 and attached thereto by clamps 94. Electric power is communicated to the cathode by means of an electrical lead 96 and a brush contact (not shown) in clamping unit 38. The brush is in contact with drive shaft 32.

A dark space shield 98 is attached to flange 18 by bolts 100. The dark space shield surrounds flange 46 and mounting plug 70. The dark space shield 98 is provided with fluid cooling channels 102. Cooling fluid is introduced into and removed from channels 102 by tubular bores 104 (FIG. 3). Mating bores and seals (not shown) and vacuum feedthroughs 106 (FIG. 2) are located in flange 18. The cooling fluid for dark space shield 98 is fed to and extracted from the shield by inlet and outlet conduits or ports 144 and 146, respectively (see FIG. 2). A dark space shield 108 is also attached to outer end 68 of cathode 64 and electrically insulated from the cathode. Additional details of the cooling and insulation of the dark space shields 98 and 108 has been omitted as it adds nothing to the understanding of the present invention.

The rotary drive for cathode 64 is provided by a motor 110. The drive is transmitted through a gearbox 112 and a shaft 113 to a pulley 114. A belt 116 transmits the drive to a pulley 118 which is keyed to the drive shaft and clamped thereon by a nut 120. The motor 110 is directly mounted to bearing housing 12 by a bracket 122. A drive shaft extension 124 and a fluid transport tube extension (not shown) therein connect cooling fluid input unit 53 and cooling output unit 54 to the cathode through fluid transport tube 52 and drive shaft 32.

As can be seem from the above description, most of bearing assembly 10 is located outside of coating chamber 42. This allows the length of cathode 64 to be increased.

A substrate 126 to be coated is transported through coating chamber 42 on rollers 128 mounted on a spindle 130. The spindle is supported on bearings 132 attached to floor 134 of the coating chamber.

The top of the coating chamber is sealed by a cover 136. More specifically, cover 136 is vacuum sealed to side walls 20 and 21 of the coating chamber. The cover 136 is removed when cathode 64 is removed, for example for maintenance.

To facilitate removal of the cathode, the cooling fluid supply and extraction system for the cathode is disconnected rom inlet and outlet ports 140 and 142. The cooling fluid supply and extraction system for the dark space shield is also disconnected from its inlet and outlet ports 144 and 146 (FIG. 2). The cooling fluid is then expelled from dark space shield 98 and cathode 64 by blowing compressed gas through inlet ports 140 and 144.

The dark space shield 98 is detached from flange 18 by removing bolts 100. The shield may be slid along the cathode body to be removed with it. The cathode 64 is next detached from flange 46.by removing bolts 76. The dark space shield and the cathode can then be lifted out of the coating chamber via the opening left by the removal of top cover 136. During the lifting operation, tube 79 unplugs from tube 52. Thus, the cathode body, and all other components located therein, may be removed from the coating chamber while bearing housing 12 and the components located therein, such as vacuum seal 40, conduit 52, and drive shaft 32, remain in place.

After removal of the cathode, mounting seal 78 is still retained in groove 77, and the cooling fluid tube connecting seals 62 are retained in grooves 60. Likewise, "O" ring seals 149 for bores 104 and mating bores (not shown) in flange 18 are retained in position by grooves 150 (see FIG. 3).

It will be evident from the above description that replacing a cathode or reinstalling the same cathode following a maintenance procedure is a relatively rapid and simple procedure. A cathode of the type discussed above, when purged of cooling fluid and detached from mounting flange 46, weighs about 150 pounds. Thus, it can be removed from the coating chamber by two persons of average lifting ability using a simple sling. An overhead crane is not required. Additionally, cathodes can be removed and replaced simultaneously, the number depending only on the available workforce. Maintenance time for the magnetron sputtering system can thus be significantly reduced and production time correspondingly increased.

The present invention has been described in terms of a preferred embodiment. The invention however is not limited to the invention described and depicted. Rather the scope of the invention is limited by the appended claims.

What is claimed is:

1. A rotatable magnetron apparatus, comprising:
a bearing housing;
a drive shaft rotatably mounted in said bearing housing with an end thereof extending into an evacuable chamber;
a vacuum seal means for sealing said drive shaft to said bearing housing so that an interior portion thereof is isolated from said chamber; and
means for removably attaching a magnetron cathode to the end of said drive shaft extending into said chamber so that said cathode may be removed from said chamber while said bearing housing remains in place.

2. The apparatus of claim 1 wherein said drive shaft is hollow and open at at least one end.

3. The apparatus of claim 2 further including a cathode and means for flowing cooling fluid to and from said cathode.

4. The apparatus of claim 3 wherein said fluid cooling means includes: a first conduit extending through said drive shaft and supported therein, and a second conduit extending into said cathode and mounted therein, said second conduit removably attached to said first conduit to be in fluid communication therewith and said second conduit removable with said cathode while said first conduit remains in said drive shaft.

5. The apparatus of claim 4 further including a magnet array supported in said cathode by said second conduit 6. The apparatus of claim 4 wherein said second conduit h a reduced outside diameter at one end thereof to facilitate attachment to said first conduit.

7. The apparatus of claim 6 further including seal means for sealing said first conduit to said second conduit.

8. The apparatus of claim 7 wherein said second conduit is supported by a plug at one end of said cathode so that said cathode can rotate about said second conduit.

9. The apparatus of claim 1 further including a cathode and wherein said removably attaching means includes a mounting member formed at one end of said cathode for removably securing said cathode to said drive shaft.

10. The apparatus of claim 9 wherein said mounting member is removably secured to a flange fixedly attached to said drive shaft.

11. The apparatus of claim 10 wherein said mounting member includes a plug at said one of said cathode, said plug including a flange portion which can be removably secured to said flange.

12. The apparatus of claim 11 further including a mounting seal for forming a vacuum seal between said flange portion and said flange.

13. The apparatus of claim 12 wherein said mounting seal includes at least two vacuum seals disposed in respective grooves in said flange.

14. The apparatus of claim 9 further including a dark space shield surrounding said removably attaching means and removably secured thereto.

15. The apparatus of claim 1 wherein said bearing housing is mounted in a side wall of said chamber.

16. An apparatus for sputtering thin films on a substrate using a rotating magnetron cathode, comprising: an evacuable coating chamber; a cantilever mounting unit mounted through a side wall of said coating chamber, said mounting unit including a bearing housing, a drive shaft mounted in said bearing housing for rotating said magnetron cathode, and a vacuum seal means for isolating at least a portion of the interior of said bearing housing from said coating chamber; means for removably attaching a cathode body of said magnetron cathode to the end of said drive shaft inside said coating chamber so that said cathode body may be detached from said drive shaft and removed from said coating chamber; and means for transporting a substrate past said magnetron cathode.

17. The apparatus of claim 16 further including a cathode body and wherein said removably attaching means includes a mounting member formed at one end of said cathode body for removably securing said cathode body to said drive shaft.

18. The apparatus of claim 17 wherein said mounting member is removably secured to a flange fixedly attached to said drive shaft.

19. The apparatus of claim 18 wherein said mounting member includes a plug at said one of said cathode body, said plug including a flange portion which can be removably secured to said flange.

20. The apparatus of claim 19 further including a mounting seal for forming a vacuum seal between said flange portion and said flange.

21. The apparatus of claim 20 wherein said mounting seal includes at least two vacuum seals disposed in respective grooves in said flange.

22. The apparatus of claim 19 further including a dark space shield surrounding said plug and said flange.

23. The apparatus of claim 19 wherein said drive shaft is hollow and open at at least one end.

24. The apparatus of claim 23 further including means for flowing cooling fluid to and from said cathode body.

25. The apparatus of claim 24 wherein said fluid cooling means includes: a first conduit extending through said drive shaft and supported therein, and a second conduct extending into said cathode body and mounted therein, said second conduit removably attached to said first conduit to be in fluid communication therewith and said second conduit removable with said cathode body while said first conduit remains in said drive shaft.

26. The apparatus of claim 25 wherein said second conduit is supported by said plug such that said cathode body can rotate about said second conduit.

27. The apparatus of claim 25 wherein said second conduit has a reduced outside diameter at one end thereof to facilitate attachment to said first conduit.

28. The apparatus of claim 27 further including vacuum seal means for rigidly securing said first conduit to said second conduit.

* * * * *

UNITED STATES PATENT AND TRADEMARK OFFICE
CERTIFICATE OF CORRECTION

PATENT NO. : 5,100,527
DATED : March 31, 1992
INVENTOR(S) : David E. Stevenson, Erik J. Bjornard, Geoffrey Humberstone It is certified that error appears in the above-indentified patent and that said Letters Patent is hereby corrected as shown below:

Column 7, line 5:

"h a" should be "has a"

Column 8, line 32:

"conduct" should be "conduit"

Signed and Sealed this

Eighth Day of June, 1993

Attest:

MICHAEL K. KIRK

Attesting Officer

Acting Commissioner of Patents and Trademarks